(12) United States Patent
Chang et al.

(10) Patent No.: US 7,411,791 B2
(45) Date of Patent: Aug. 12, 2008

(54) EXTENDABLE HEAT DISSIPATION APPARATUS

(75) Inventors: Chien-Lung Chang, Taipei (TW); Fen-Ying Li, Taipei (TW); Kuo-Hsun Huang, Taipei (TW)

(73) Assignee: ASUSTeK Computer Inc., Peitou, Taipei (TW)

( * ) Notice: Subject to any disclaimer, the term of this patent is extended or adjusted under 35 U.S.C. 154(b) by 100 days.

(21) Appl. No.: 11/446,970

(22) Filed: Jun. 6, 2006

(65) Prior Publication Data

US 2007/0008702 A1    Jan. 11, 2007

(30) Foreign Application Priority Data

Jul. 8, 2005    (TW) ............................... 94123269 A

(51) Int. Cl.
*H05K 7/20*    (2006.01)
*H01L 23/36*   (2006.01)

(52) U.S. Cl. ..................... 361/703; 361/700; 361/701; 361/704; 165/80.3; 165/80.4; 165/104.33; 165/185; 257/718; 257/719

(58) Field of Classification Search ................. 361/700, 361/703, 704–717, 719; 257/718, 719, 722, 257/726, 727, 732; 165/80.2, 80.3, 80.4, 165/80.5, 104.21, 104.26, 104.33, 104.34, 165/185; 174/16.3, 252
See application file for complete search history.

(56) References Cited

U.S. PATENT DOCUMENTS 6,864,573 B2 * 3/2005 Robertson et al. ............ 257/718
2005/0248918 A1 * 11/2005 Lin .............................. 361/687

FOREIGN PATENT DOCUMENTS

CN       1293774 A       5/2001
JP       406021281 A  *  1/1994

* cited by examiner

*Primary Examiner*—Michael V Datskovskiy
(74) *Attorney, Agent, or Firm*—Muncy, Geissler, Olds & Lowe, PLLC

(57) ABSTRACT

An extendable heat dissipation apparatus includes a base, an extendable heat dissipation member and a connecting element. A normal fin is formed on the base, and the connecting element integrates the extendable heat dissipation member in the apparatus with the base. The extendable heat dissipation member can be extendable to an extending location and can also be stored in a storing location with respect to the base.

19 Claims, 7 Drawing Sheets

EXTENDABLE HEAT DISSIPATION APPARATUS

RELATED APPLICATIONS

The present application is based on, and claims priority from, Taiwan Application Serial Number 94123269, filed Jul. 8, 2005, the disclosure of which is hereby incorporated by reference herein in its entirety.

BACKGROUND

1. Field of Invention

The present invention relates to a heat dissipation apparatus. More particularly, the present invention relates to a heat dissipation apparatus which can extend to increase heat dissipation area.

2. Description of Related Art

As electric technology grows rapidly, devices operate at higher and higher speeds and consequently produce and accumulate more and more heat. When safe operational temperatures are surpassed, devices fail to work and may even break down.

A conventional heat dissipation technique is to attach a heat dissipation apparatus 100 to an electrical device such as a chip, as shown in FIG. 1, and even to mount a fan on the heat dissipation apparatus 100. A heat pipe may also be used to improve heat transfer efficiency.

In computer systems, interior space varies depending on the computer case to which the motherboard corresponds; for example, ATX and AT motherboards. Conventionally, for a heat dissipation apparatus installed on a chip of an add-in card such as an accelerated graphics port (AGP) card, the heat dissipation efficiency of the apparatus varies slightly between computer systems of different sizes due to a constant dimension and surface area of the heat dissipation apparatus relative to the volume of each computer system.

To improve the heat dissipation efficiency, most conventional techniques enlarge the scale of the heat dissipation apparatus to increase the heat dissipative area, resulting in a specific and limited applicability.

For the foregoing reasons, there is a need for a heat dissipation apparatus effectively utilizing spare space in systems of various dimensions to gain a heat dissipation benefit.

SUMMARY

It is therefore an aspect of the present invention to provide an extendable heat dissipation apparatus for more flexibility of adjusting heat dissipation area for different system dimensions.

It is another aspect of the present invention to provide an extendable heat dissipation apparatus for fully utilizing spare space within an electrical system to raise heat dissipation efficiency.

It is another aspect of the present invention to provide an extendable heat dissipation apparatus for enlarging heat dissipation area above a north bridge chip or a CPU in a computer system, and moreover, for improving convection effect by a CPU fan.

In accordance with the foregoing and other aspects of the present invention, an extendable heat dissipation apparatus for adjusting heat dissipation area is provided. The extendable heat dissipation apparatus includes a base, an extendable heat dissipation member and a connecting element. The connecting element is coupled between the base and the extendable heat dissipation member. The extendable heat dissipation member is integrated in the heat dissipation apparatus through the connecting element and extends to an extending location with respect to the base.

According to a preferred embodiment, an extendable heat dissipation apparatus is applied in a computer system and installed on an add-in card near a north bridge chip. The extension of the extendable heat dissipation member to the space above the north bridge chip or a CPU not only leads to a larger heat dissipation area, but obtains an advantageous convection by airflow from a CPU fan in the space; therefore heat dissipation efficiency is improved.

In conclusion, the extendable heat dissipation apparatus of the invention is applicable to various dimensions of electrical systems such as computer systems and is able to adjust heat dissipation area of the heat dissipation apparatus so that spare space within the system can be utilized fully. Especially for application in a computer system, when space above a north bridge chip is used for extension of the heat dissipation apparatus, a CPU fan also provides a heat convection for the apparatus to obtain a better heat dissipation effect.

It is to be understood that both the foregoing general description and the following detailed description are by examples and are intended to provide further explanation of the invention as claimed.

BRIEF DESCRIPTION OF THE DRAWINGS

These and other features, aspects and advantages of the present invention will become better understood with regard to the following description, appended claims and accompanying drawings where:

DESCRIPTION OF THE PREFERRED EMBODIMENTS

Figure 1:
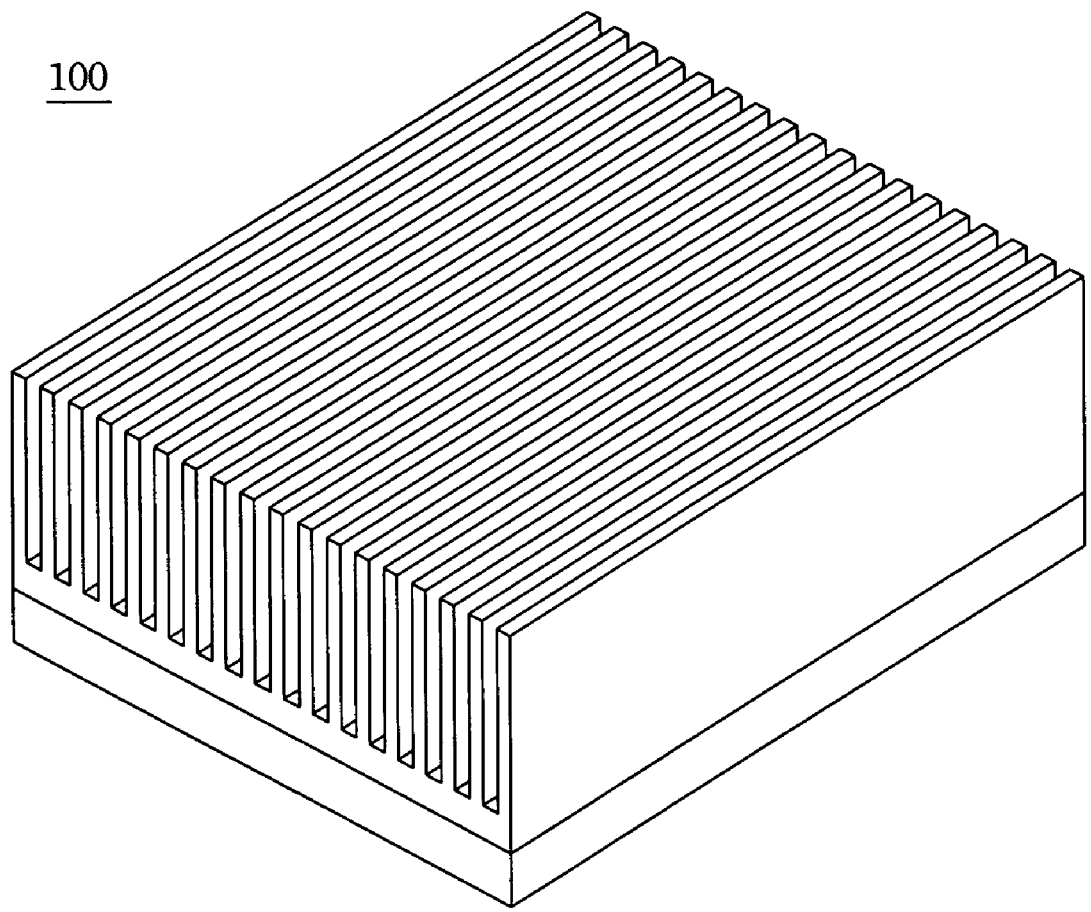
FIG. 1 is a schematic diagram of a conventional heat dissipation apparatus.

The present invention provides users with an adjusting mechanism through an extendable heat dissipation member, such that the heat dissipation apparatus can be expanded to achieve a larger heat dissipation area and a better heat dissipation efficiency according to a system volume, thus fully utilizing spare space in the system to improve heat dissipation, especially for systems with enough space.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
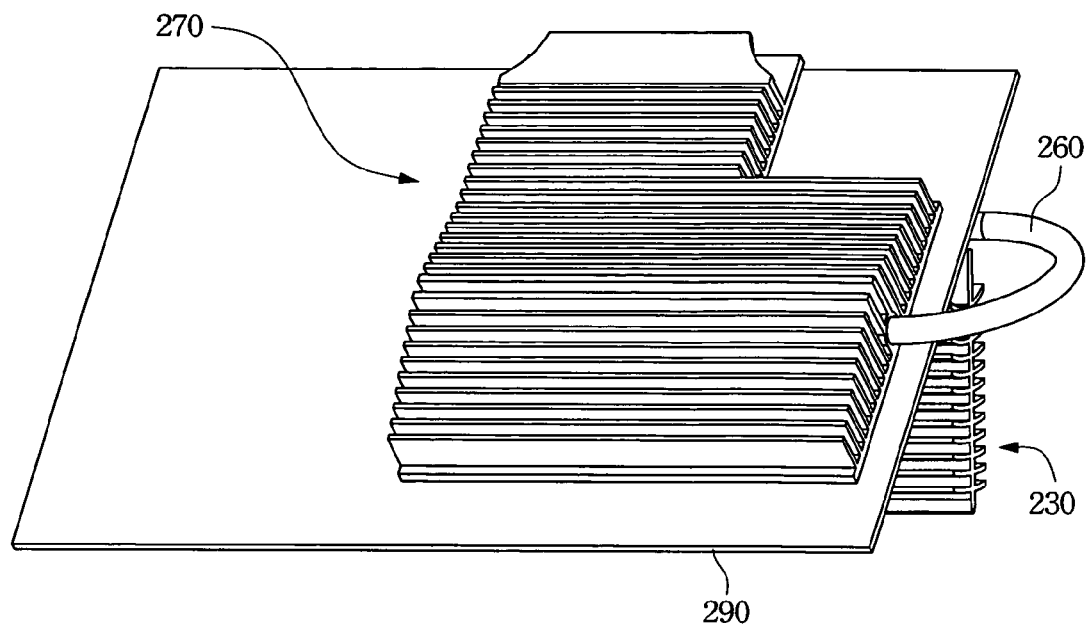
FIG. 2A is an oblique view of an extendable heat dissipation apparatus in accordance with a preferred embodiment of the present invention.
Figure 2B:
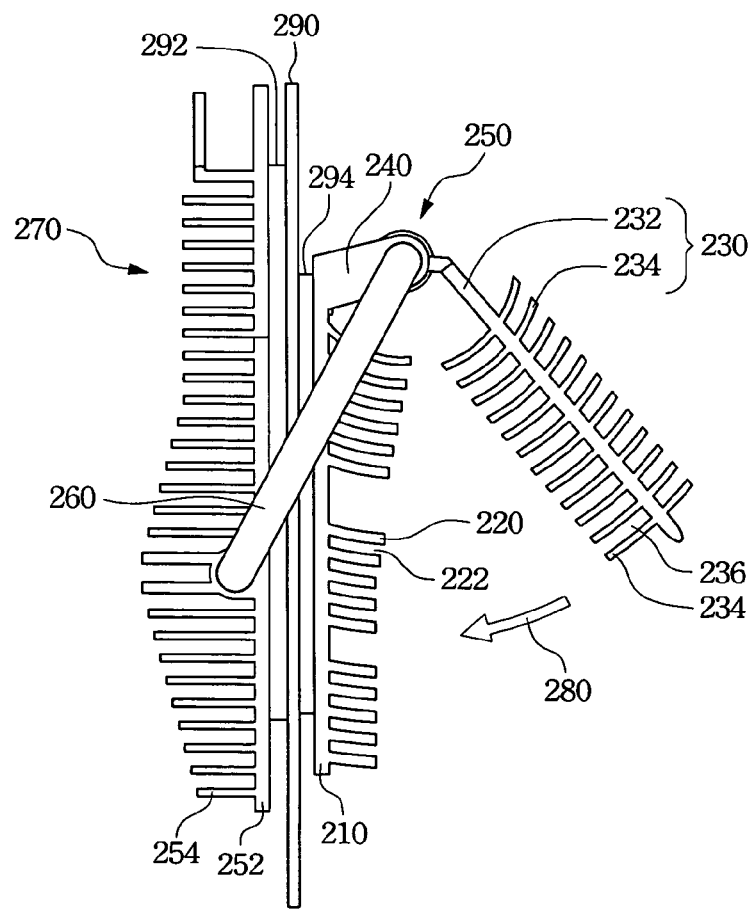
FIG. 2B is a side view of the extendable heat dissipation apparatus in FIG. 2A.

FIGS. 2A and 2B are respectively an oblique view and a side view of an extendable heat dissipation apparatus in accordance with a preferred embodiment of the present invention. The extendable heat dissipation apparatus 250 includes a base 210, an extendable heat dissipation member 230, and a connecting element 240. The connecting element 240 is coupled with the base 210 and the extendable heat dissipation member 230, and the extendable heat dissipation member 230 extends to an extended location away from the base 210.

In the embodiment, a plurality of normal fins 220 are fixed on the base 210, and a circuit board 290 has chips 292 and 294 on both sides. A combination of the circuit board and the chip may be a computer motherboard with a south bridge chip, a north bridge chip or other functional chips; the combination may also be an add-in card board with chips, such as a graphics card with image processing chips.

The extendable heat dissipation apparatus 250 is attached on the side of the chip 294 on the circuit board 290, and a plurality of first normal fins 220 are fixed on a first base 210. A connecting element 240, such as a pivoting mechanism, is disposed on the first base 210 and makes a structural connection between an extendable heat dissipation member 230 and the first base 210. The extendable heat dissipation member 230 includes a body 232 and a plurality of extending fins 234 thereon.

Preferably, the extending fins 234 are arranged such that when the extendable heat dissipation member 230 is rotated towards the first base 210 to be stored, as along an arrow 280, each of the extending fins 234 is inserted correspondingly in a first fin gap 222 defined by the first normal fins 220, and each of the first normal fins 220 is inserted in an extending fin gap 236 likewise defined by the extending fins 234. In other words, the apparatus can be either folded so that fins are intermeshed (but not in contact with each other), or unfolded so that extending fins are fully exposed. The connecting element 240 enable extending and storing of the extendable heat dissipation member 230 with respect to the base 210; therefore, the apparatus provides dimensional flexibility.

More preferably, a second heat dissipation apparatus 270 is further attached on the side of the chip 292 on the circuit board 290, wherein a typical heat dissipation apparatus is used in the embodiment. Alternatively, another extendable heat dissipation apparatus may be used. The second heat dissipation apparatus 270 includes a second base 252 attached to the chip 292 and a plurality of second normal fins 254 formed or set on the second base 252.

Further, a heat pipe 260 is connected between the second heat dissipation apparatus 270 and the extending heat dissipation apparatus 250. In the embodiment, a U-shaped heat pipe is used and is connected to the extendable heat dissipation member 230 of the extendable heat dissipation apparatus 250, whereby heat from the second heat dissipation apparatus 270 is transferred more efficiently to the extendable heat dissipation apparatus 250 and fully utilizes the extendable heat dissipation member 230 to dissipate heat. The heat pipe 260 can also be connected between the first base 210 and the extendable heat dissipation member 230 to improve the heat dissipation efficiency of the apparatus itself.

It should be noted that the fins are not limited to the structure and shape described in the embodiment.

Figure 3A:
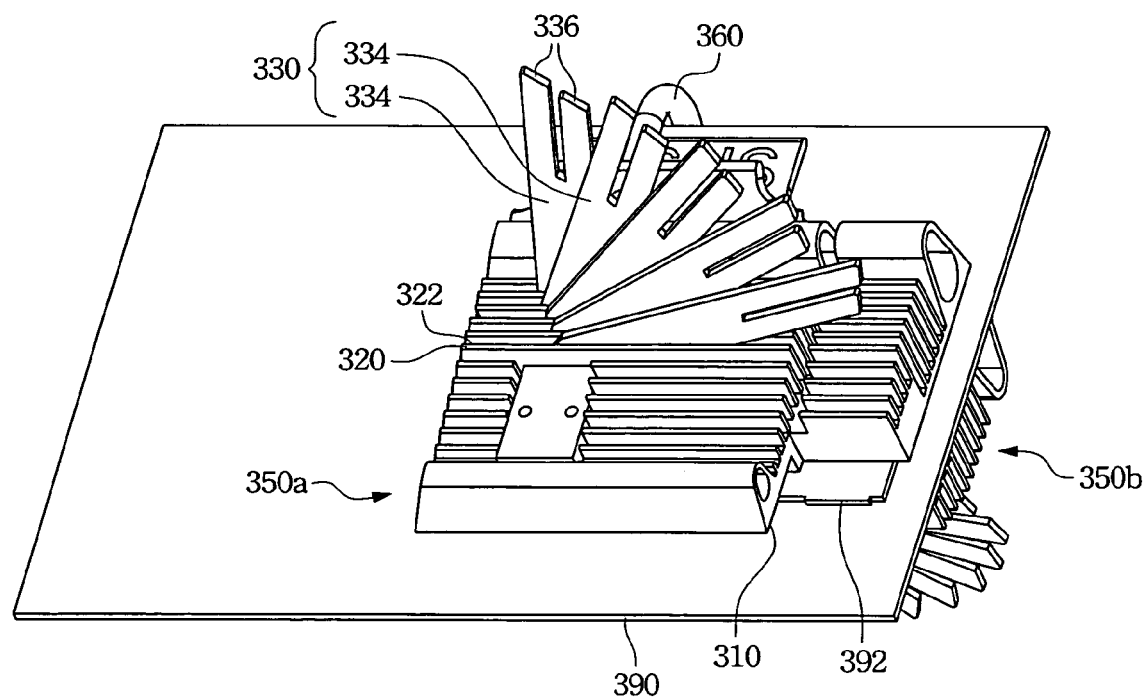
FIG. 3A is an oblique view of an extendable heat dissipation apparatus in accordance with another preferred embodiment of the present invention.
Figure 3B:
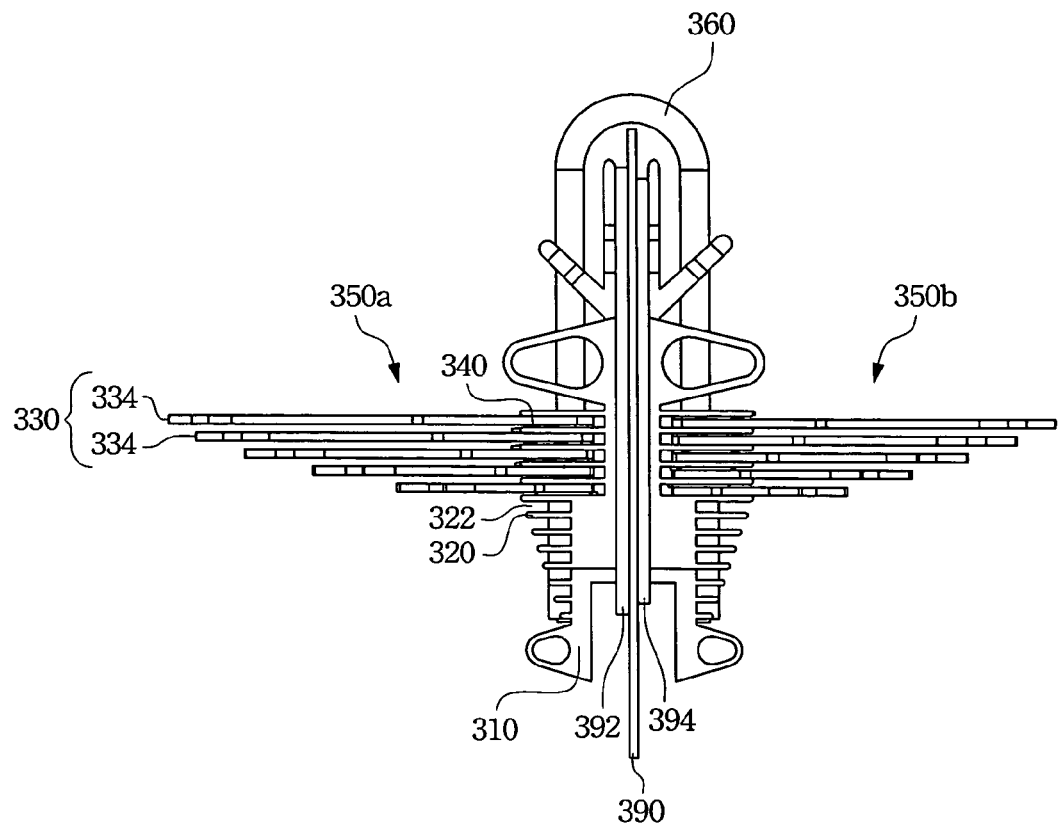
FIG. 3B is a side view of the extendable heat dissipation apparatus in FIG. 3A.

Reference is made to FIGS. 3A and 3B, which illustrate an oblique view and a side view of the extendable heat dissipation apparatus in accordance with another preferred embodiment of the present invention. In the embodiment, chips 392 and 394 disposed on both sides of a circuit board 390 are attached to a first extendable heat dissipation apparatus 350a and a second extendable heat dissipation apparatus 350b, respectively. The extendable heat dissipation apparatus 350a includes a base 310, a plurality of normal fins 320 formed or set on the base 310, and an extendable heat dissipation member 330 coupled to the base through a connecting element 340.

In the embodiment, the connecting element 340 is a flat spring and the extendable heat dissipation member 330 is formed as a plurality of spread fins 334. The flat spring set in a fin gap 322 defined by the normal fins 320 is coupled to and constrainedly accommodates the corresponding spread fin 334 in the fin gap 322. The flat spring allows the spread fin 334 to contact the base 310 and the normal fins 320 closely and tightly, promoting distribution of heat to the spread fin 334 so that heat dissipation area of the spread fins 334 can be utilized.

In a narrow and small system, the extendable heat dissipation member 330 can be stored in a storing location, that is in the fin gap 322. In a large and wide system, a portion of the extendable heat dissipation member 330 can be rotated to depart from constraint by the flat spring to spread to an extended location so that available space is effectively used. Further, a heat pipe 360 is used to connect the extendable heat dissipation apparatuses 350a and 350b for improving heat transfer.

A spread angle of the extendable heat dissipation member 330 is determined by the flat spring, wherein a sequential arrangement of spread angles with different degrees is preferable, such as an arrangement of increasing angles for reducing overlapping areas between the spread fins 334, in order to reduce heat dissipation efficiency loss. The spread fins 334 may include a forked end 336 in consideration of an optimal heat dissipation area, but the number of the forked ends is not limited to what is shown in the embodiment.

Some or all of the base, fins and the connecting element are made of a metal with high heat transfer coefficient such as copper or aluminum.

Figure 4:
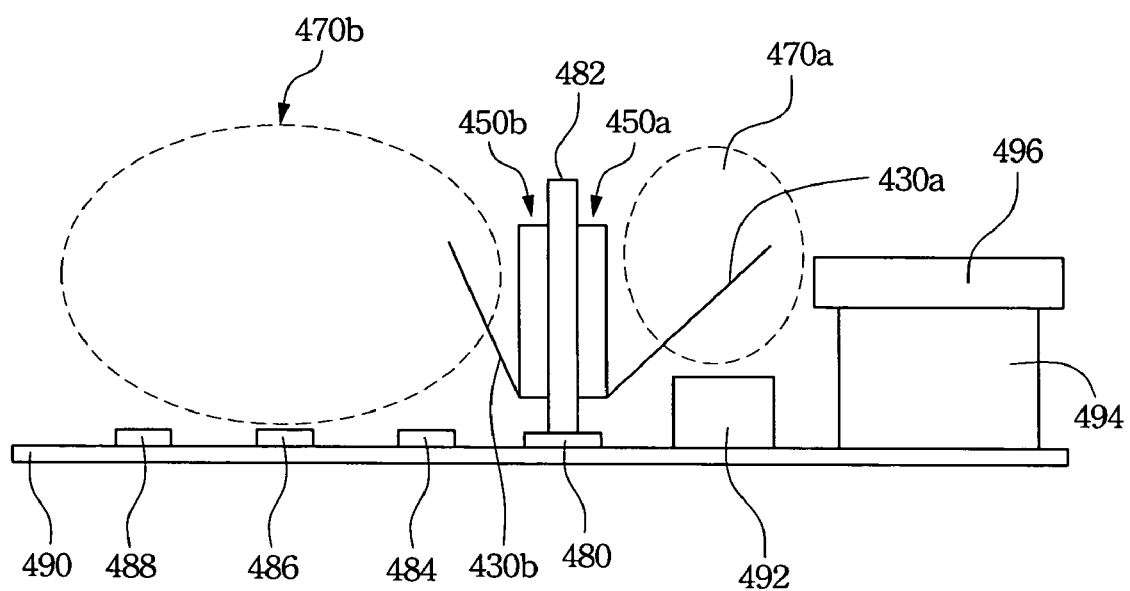
FIG. 4 is a schematic diagram of the extendable heat dissipation apparatus applied in a computer system.

Reference is made to FIG. 4, which illustrates a schematic diagram of the extendable heat dissipation apparatus applied in a computer system. The heat dissipation apparatus of the present invention can be applied to various motherboard specifications, which often correspond to computer cases of different dimensions. The extendable heat dissipation apparatus is adjustable to meet a specific case dimension.

As shown in the figure, a CPU 494, a north bridge chip 492, an adjacent expansion slot 480, and a plurality of expansion slots 484–488 is set on a motherboard 490. The specification of the motherboard may be ATX or Baby AT, and the expansion slots may be AGP, PCI or a PCI Express bus interface. A fan 496 is installed on the CPU 494 for cooling. An add-in card 482 is inserted in the adjacent expansion slot 480, which is adjacent to the north bridge chip 492; and a first extendable heat dissipation apparatus 450a and a second extendable heat dissipation apparatus 450b are installed on both sides of the add-in card 482.

The extendable heat dissipation apparatuses 450a and 450b can extend respectively into a first space 470a above the north bridge chip 492 and a second space 470b above the expansion slots 484-488 with individual extendable heat dissipation members. When the system operates, the heat dissipation area of the first extendable heat dissipation apparatus 450a is increased by spreading the first extendable heat dissipation member 430a into the first space 470a, and airflow from the fan 496 on the CPU 494 also provides convection of the extendable heat dissipation apparatus 450a.

Preferably, when other expansion slots such as the slot 484 are unused, the second extendable heat dissipation member 430b of the second extendable heat dissipation apparatus 450b is further spread into the second space 470b, achieving a larger heat dissipation area.

The extent to which the extendable heat dissipation member extends depends on the motherboard configuration and is not limited to the space above the north bridge chip in the embodiment; for example, the space above the CPU may also be an extended space in a different specification motherboard. Each space can effectively utilize the airflow provided by the CPU fan to improve heat dissipation efficiency.

Figure 5:
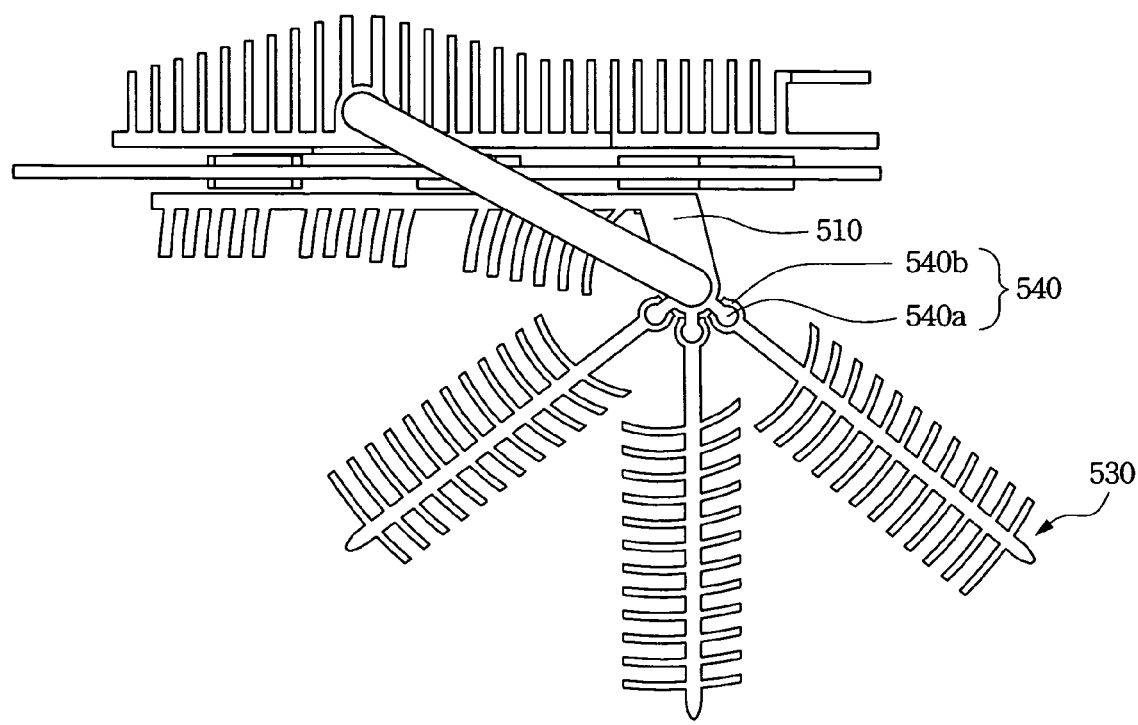
FIG. 5 is a side view of an extendable heat dissipation apparatus in accordance with another preferred embodiment of the present invention.

Reference is now made to FIG. 5, showing a side view of an extendable heat dissipation apparatus in accordance with another preferred embodiment of the present invention. In the embodiment, a connecting element 540 includes an engaging part 540a and an engaging groove member 540b. The engaging part is coupled with a base 510, and the engaging groove member is connected with an extendable heat dissipation member 530. When the extendable heat dissipation member 530 is to be spread, the engaging part 540a is engaged with the engaging groove member 540b, which structurally connects the extendable heat dissipation member 530 with the base 510. Larger contacting area and tighter contact between the extendable heat dissipation member 530 and the base 510 makes better heat transfer effect. Therefore, the extendable heat dissipation member 530 shares the burden of heat dissipation by way of expanding heat dissipation area within an extra available space.

Combination of the engaging part 540a and the engaging groove member 540b is not limited to the embodiment; for example, arrangement of the engaging part 540a and the engaging groove member 540b is interchangeable, shapes and outlines of which are not limited therein. Any connecting element that connects the extendable heat dissipation member 530 with the base 510 is included in the present invention.

Figure 6:
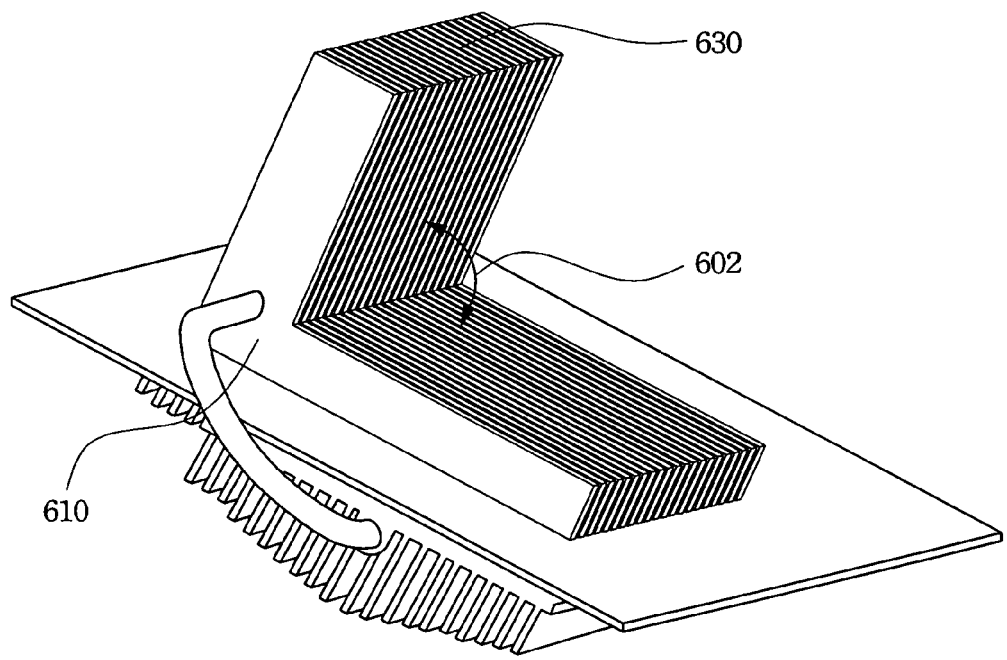
FIG. 6 is an oblique view of an extendable heat dissipation apparatus in accordance with another preferred embodiment of the present invention.

FIG. 6 shows an oblique view of an extendable heat dissipation apparatus in accordance with another preferred embodiment of the present invention, in which an extendable heat dissipation member 630 is connected to the base 610 at a predetermined angle 602 that determines space occupied by the extendable heat dissipation member 630. Thus, the angle is designed to comply with a practical environment; for example, it may be L-shaped and about 90 degrees.

Figure 7A:
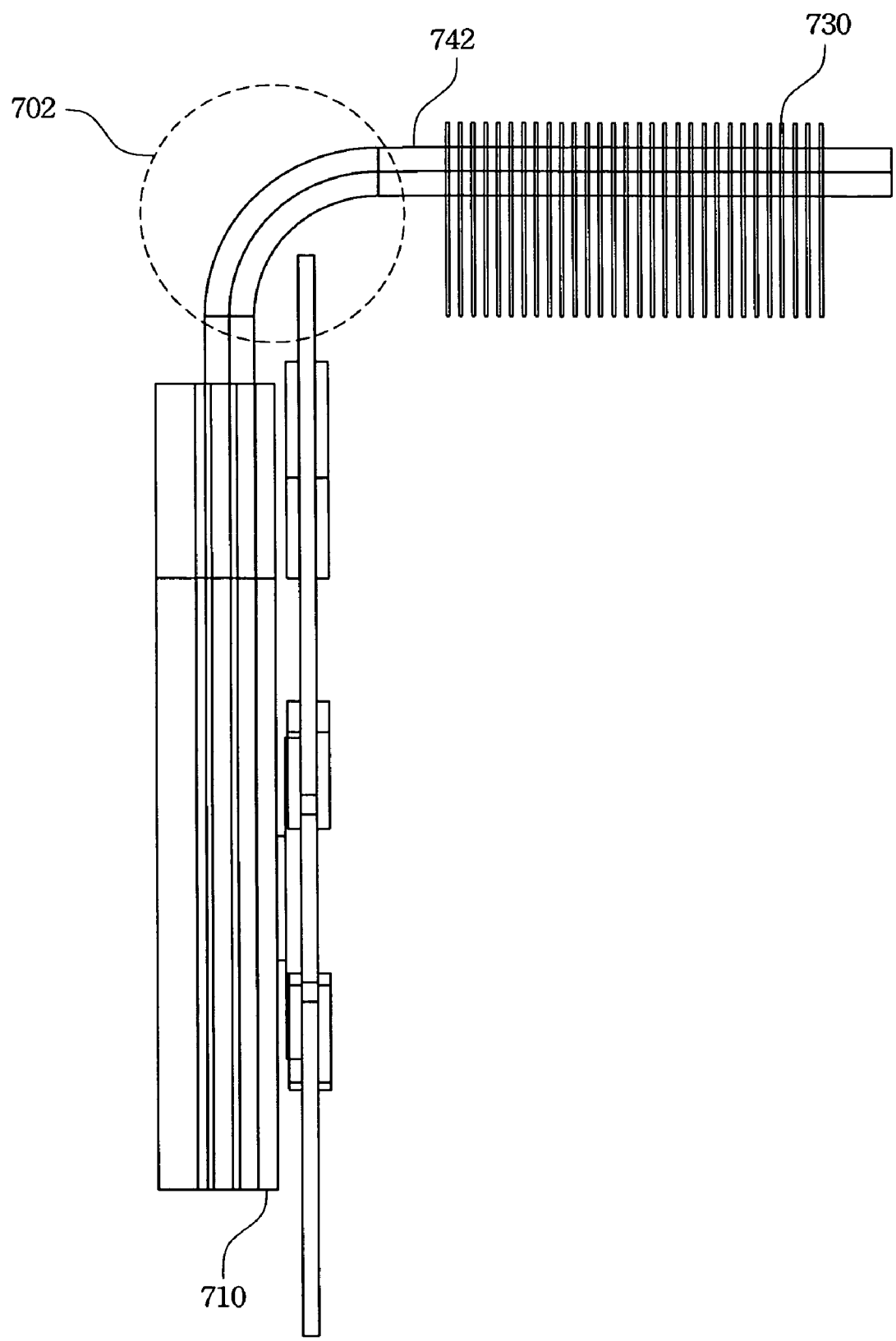
FIG. 7A is a side view of an extendable heat dissipation apparatus in accordance with another preferred embodiment of the present invention.

Reference is now made to FIG. 7A, which shows a side view of an extendable heat dissipation apparatus in accordance with another preferred embodiment of the present invention. In the embodiment, a connecting element is a heat pipe 742. The heat pipe 742 is coupled to a base 710 with an end and extends out of the base 710 with another end. A bend 702 is formed between two ends, such as a 90-degree bend. An extendable heat dissipation member 730 is coupled with the extending end of the heat pipe 742.

Figure 7B:
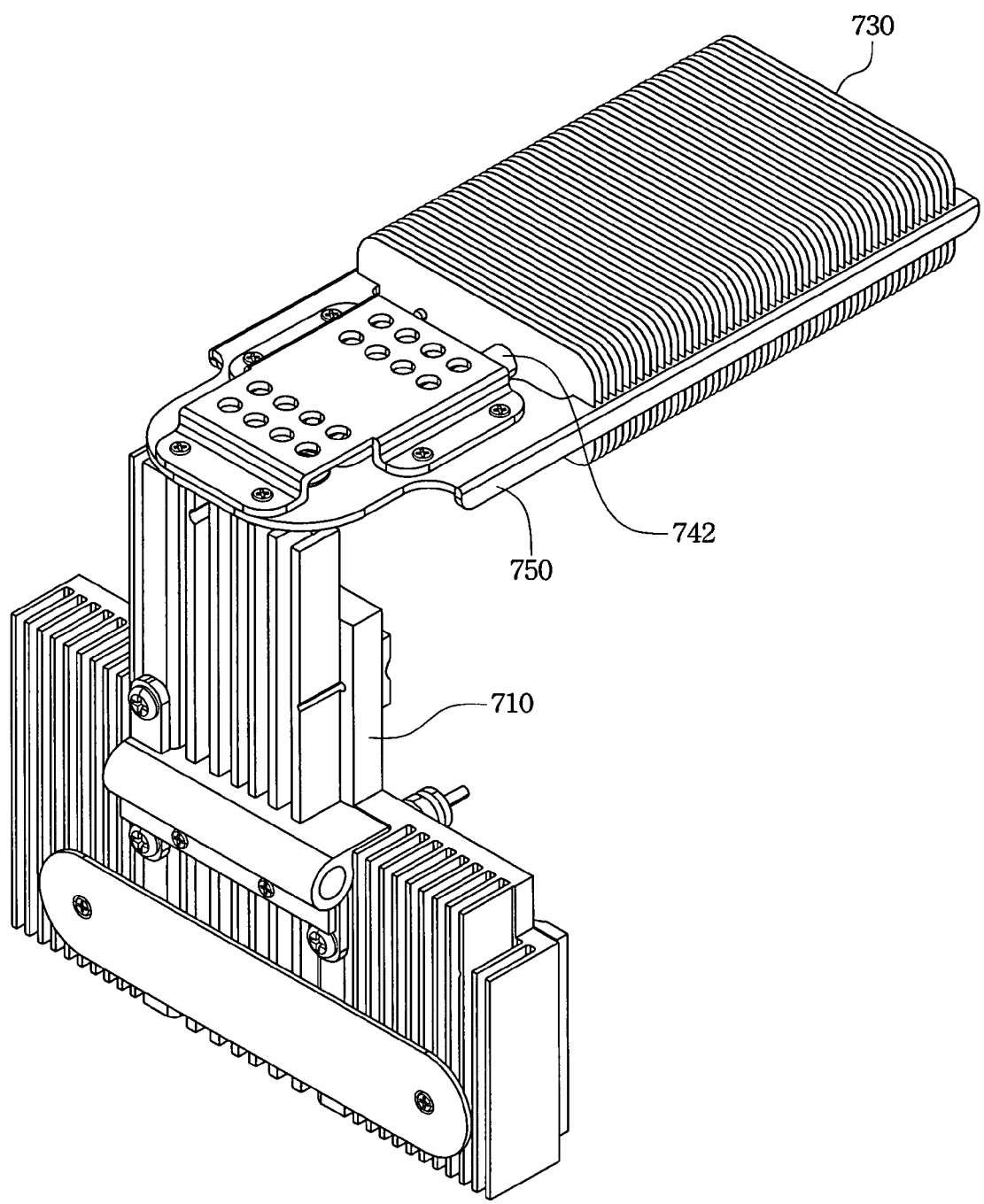
FIG. 7B is an oblique view of another aspect of the extendable heat dissipation apparatus in FIG. 7A.

FIG. 7B is an oblique view of another aspect of the extendable heat dissipation apparatus in FIG. 7A. In the figure, the heat pipe 742 is coupled with the extendable heat dissipation member 730 and the base 710, and the extendable heat dissipation member 730 is firmly supported by a bracket 750. The extending orientation of the extendable heat dissipation member 730 can be changed by the heat pipe 742.

The present invention has at least the following advantage. The extendable heat dissipation apparatus integrates an extendable heat dissipation member and provides modes of storing and extending. The extending mode presents various forms corresponding to different system dimensions, and a wider extending range makes larger heat dissipation area and better heat dissipation efficiency. Therefore, the present invention effectively utilizes available space in a system and achieves a better heat dissipation efficiency.

Especially for application in a computer system, the extendable heat dissipation apparatus makes use of space above unused expansion slots for increasing extra heat dissipation area, and space above the north bridge chip along with the CPU fan for providing improved convection of the extendable heat dissipation member, which significantly helps the operational stability of the computer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An extendable heat dissipation apparatus, comprising:
   a base;
   a connecting element coupled to the base; and
   an extendable heat dissipation member coupled with the connecting element and being extendable to an extended location with respect to the base, wherein the connecting element is a flat spring.

2. The extendable heat dissipation apparatus of claim 1, wherein the connecting element is a pivoting mechanism.

3. The extendable heat dissipation apparatus of claim 1, wherein the extendable heat dissipation member comprises a body and a plurality of extending fins on the base.

4. The extendable beat dissipation apparatus of claim 1, wherein the extendable heat dissipation member is stored in a storing location with respect to the base under storing mode.

5. The extendable heat dissipation apparatus of claim 1, further comprising a plurality of normal fins set on the base.

6. The extendable heat dissipation apparatus of claim 5, wherein the extendable heat dissipation member is a spread fin and is stored in a gap between the normal fins under storing mode.

7. The extendable heat dissipation apparatus of claim 1, wherein the connecting element comprises an engaging part coupled with the base and an engaging groove member coupled with the extendable heat dissipation member and is engaged with the engaging part.

8. The extendable heat dissipation apparatus of claim 1, wherein the extendable heat dissipation member is connect to the base at a predetermined angle.

9. The extendable heat dissipation apparatus of claim 1, further comprising a heat pipe with its both ends coupled respectively to the extendable heat dissipation member and the base.

10. The extendable heat dissipation apparatus of claim 1, wherein the connecting element is a heat pipe with its both ends coupled respectively to the extendable heat dissipation member and the base.

11. The extendable heat dissipation apparatus of claim 1, wherein the extendable heat dissipation member extends above a north bridge chip or a CPU.

12. An extendable heat dissipation apparatus, comprising:
   a base;
   a pivoting mechanism fixed on the base; and
   an extendable heat dissipation member comprising:
   a body coupled to the pivoting mechanism;
   a plurality of extending fins on the body; and
   a plurality of normal fins on the base, wherein the pivoting mechanism enable the extendable heat dissipation member to be extendable to an extended location or to store in a storing location with respect to the base, and when the extendable heat dissipation member is stored, the extending fins are inserted into fin gaps between the normal fins.

13. The extendable heat dissipation apparatus of claim 12, further comprising a heat pipe with its both ends coupled respectively to the extendable heat dissipation member.

14. An extendable heat dissipation apparatus, comprising:
a base;
a plurality of flat springs set on the base; and
an extendable heat dissipation member comprising a plurality of spread fins coupled to the flat springs correspondingly,
wherein the flat springs enable the spread fins to be extendable to an extended location or to store in a storing location with respect to the base.

15. The extendable heat dissipation apparatus of claim 14, further comprising a heat pipe with its both ends coupled respectively to the spread fins and the base for improving heat transfer.

16. The extendable heat dissipation apparatus of claim 14, wherein the base has a plurality of normal fins, and the spread fins are accommodated within gaps between the normal fins.

17. The extendable heat dissipation apparatus of claim 14, wherein the spread fins have forked ends.

18. An extendable heat dissipation apparatus, comprising:
a base;
a connecting element coupled to the base;
an extendable heat dissipation member coupled with the connecting element and being extendable to an extended location with respect to the base; and
a heat pipe with its both ends coupled respectively to the extendable heat dissipation member and the base.

19. An extendable heat dissipation apparatus, comprising:
a base;
a connecting element coupled to the base; and
an extendable heat dissipation member coupled with the connecting element and being extendable to an extended location with respect to the base, wherein the connecting element is a heat pipe with its both ends coupled respectively to the extendable heat dissipation member and the base.

* * * * *